(12) United States Patent
Bade et al.

(10) Patent No.: US 12,160,957 B2
(45) Date of Patent: Dec. 3, 2024

(54) OPTICAL SPRAY PATTERN IMAGING APPARATUS INCLUDING PERMANENTLY INTEGRATED LIGHT PLANE AND IMAGE CAPTURE COMPONENTS

(71) Applicant: Spraying Systems Co., Wheaton, IL (US)

(72) Inventors: Kyle M. Bade, Rockford, MI (US); Rudolf J. Schick, Forest Park, IL (US); Philip A. McDonough, Chicago, IL (US)

(73) Assignee: Spraying Systems Co., Wheaton, IL (US)

( * ) Notice: Subject to any disclaimer, the term of this patent is extended or adjusted under 35 U.S.C. 154(b) by 188 days.

(21) Appl. No.: 17/974,139

(22) Filed: Oct. 26, 2022

(65) Prior Publication Data
US 2023/0051971 A1    Feb. 16, 2023

Related U.S. Application Data

(63) Continuation-in-part of application No. 16/864,969, filed on May 1, 2020, now Pat. No. 11,538,233.

(60) Provisional application No. 62/842,964, filed on May 3, 2019.

(51) Int. Cl.
| | |
|---|---|
| *H04N 7/18* | (2006.01) |
| *G02B 27/64* | (2006.01) |
| *G03B 17/56* | (2021.01) |
| *H04N 23/54* | (2023.01) |
| *H05K 13/08* | (2006.01) |

(52) U.S. Cl.
CPC ......... *H05K 13/081* (2018.08); *G02B 27/646* (2013.01); *G03B 17/561* (2013.01); *H04N 23/54* (2023.01)

(58) Field of Classification Search
CPC ........ H05K 13/081; H04N 23/54; H04N 7/18; G02B 27/646; G03B 17/561
USPC ......................................................... 382/181
See application file for complete search history.

(56) References Cited

U.S. PATENT DOCUMENTS

| | | |
|---|---|---|
| 4,614,300 A | 9/1986 | Falcoff |
| 6,785,400 B1 | 8/2004 | Farina |

(Continued)

OTHER PUBLICATIONS

European Patent Office, International Search Report in corresponding International Application No. PCT/US2020/031098, dated Jul. 21, 2020 (12 pages).

(Continued)

*Primary Examiner* — Trang U Tran
(74) *Attorney, Agent, or Firm* — Leydig, Voit & Mayer, Ltd.

(57) ABSTRACT

A pre-calibrated spray plane image acquisition device is described that includes, in a single fixed-form structure, both an image capture component configured to acquire an optical image of a field of view and a light plane generator configured to generate a planar light plane emitted from the pre-calibrated spray plane image acquisition device. A carrier frame structure includes rigid components for permanently maintaining the image capture component and the light plane generator in respective positions defining a permanent spatial relationship between the field of view of the image capture component and the light plane generated by the light plane generator.

5 Claims, 17 Drawing Sheets

(56) References Cited

U.S. PATENT DOCUMENTS

| | | | |
|---|---|---|---|
| 7,182,271 B2 * | 2/2007 | Cesak | G01P 13/0086 |
| | | | 239/69 |
| 7,738,694 B2 | 6/2010 | Prociw et al. | |
| 8,351,780 B2 | 1/2013 | Mehring | |
| 8,465,792 B2 | 6/2013 | Marriott et al. | |
| 11,378,523 B1 * | 7/2022 | Moor | G01M 11/0278 |
| 2003/0178503 A1 | 9/2003 | Horan et al. | |
| 2020/0130005 A1 * | 4/2020 | Schoen | B05B 12/082 |
| 2021/0170593 A1 | 6/2021 | Yoneyama | |
| 2022/0291664 A1 | 9/2022 | Shapiro et al. | |
| 2022/0326687 A1 | 10/2022 | Bade et al. | |

OTHER PUBLICATIONS

Anonymous, "SprayMaster Spray Imaging Systems for Quantitative Spray Analysis," LaVision, Apr. 5, 2017, XP055708232 (16 pages).

Lavision GMBH, "SprayMaster Inspex," Mar. 1, 2019, XP055707980 (13 pages).

Lavision GMBH, "DaVis—Software Solution for Intelligent Imaging," Mar. 12, 2019, XP055708253 (10 pages).

Anonymous, "DaVis Software for Intelligent Imaging," Apr. 5, 2017, XP055708254 (20 pages).

Anonymous, "Introducing the SprayScanmPT," Dec. 16, 2019, XP055708003 (2 pages).

United States Patent and Trademark Office, Office Action in corresponding U.S. Appl. No. 16/864,969, dated May 26, 2022 (9 pages).

International Bureau, International Search Report in International Application No. PCT/US 23/35763, mailed Feb. 8, 2024.

* cited by examiner

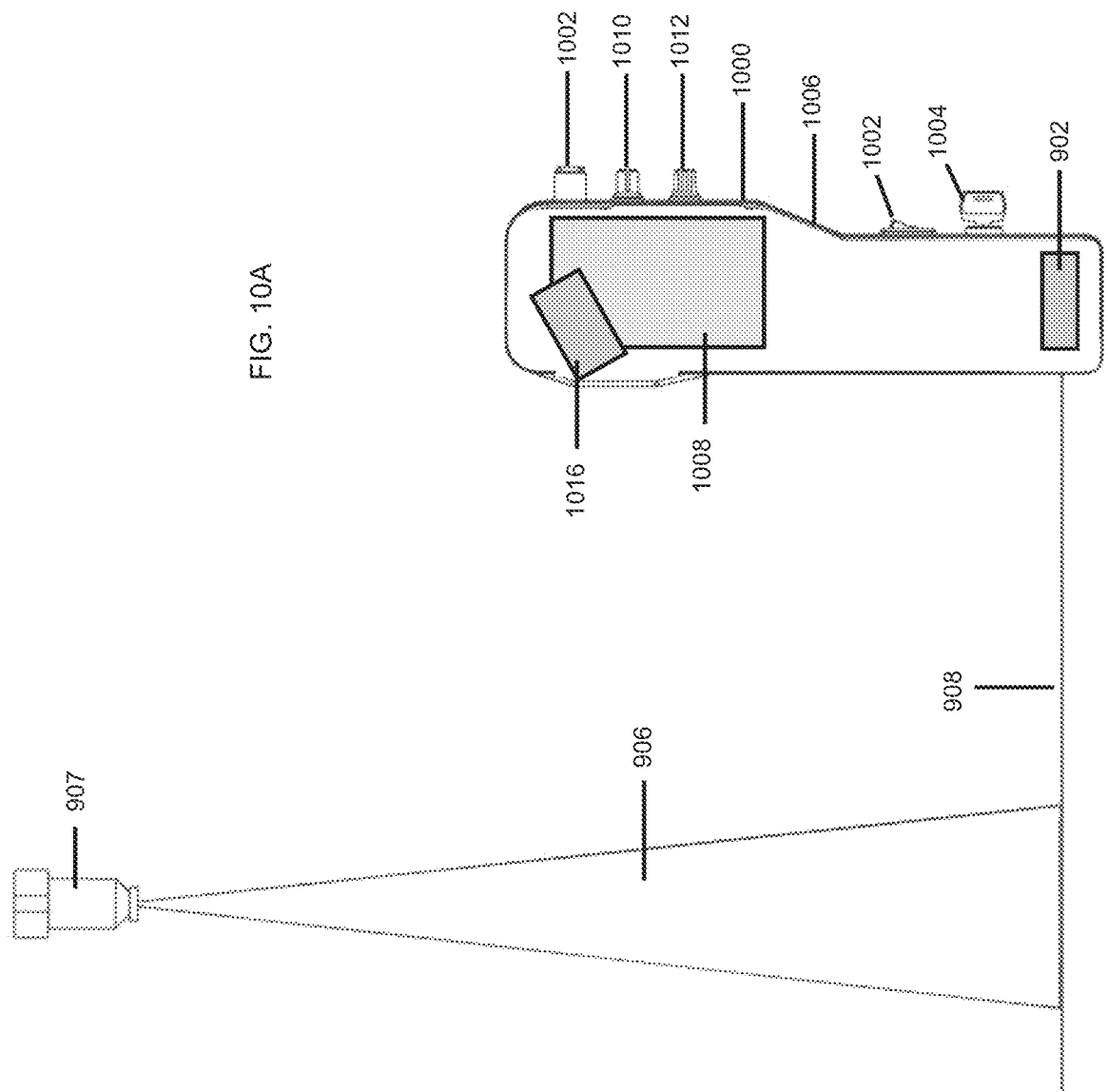

OPTICAL SPRAY PATTERN IMAGING APPARATUS INCLUDING PERMANENTLY INTEGRATED LIGHT PLANE AND IMAGE CAPTURE COMPONENTS

CROSS-REFERENCE TO RELATED APPLICATIONS

This application is a continuation-in-part of U.S. application Ser. No. 16/864,969, filed May 1, 2020, entitled "OPTICAL SPRAY PATTERN IMAGING APPARATUS FOR GENERATING IMAGES INCLUDING DENSITY IMAGE FEATURES," which is a non-provisional of and claims priority to U.S. Provisional Application Ser. No. 62/842,964, filed May 3, 2019, entitled "OPTICAL SPRAY PATTERN IMAGING APPARATUS FOR GENERATING IMAGES INCLUDING DENSITY IMAGE FEATURES," the contents of which are expressly incorporated herein by reference in their entirety, including any references therein.

TECHNICAL FIELD

The present invention relates generally to spray pattern imaging apparatuses, and more particularly, to systems for acquiring and processing one or more spray pattern images to render a spray pattern for testing a combination of spray nozzle and sprayed material.

BACKGROUND

Spraying applications are characterized by a combination of spray nozzle configuration and sprayed material specification. The spray nozzle configuration comprises one or more spray nozzles configured in a three-dimensional space—including both distance and direction characteristics. The sprayed material specification comprises one or more sprayed materials (mixed at particular ratios) having particular fluid characteristics—including viscosity, surface tension, volatility, etc.).

Users of such systems have a strong interest in ensuring that a particular spraying application will provide a particular desired coverage—e.g., both complete coverage and even distribution of a particular desired amount. Highly complex systems provide such information using high precision measuring devices that carry out testing and/or optimization offline and in a controlled setting. Such systems are both extremely expensive and require complex testing procedures that may take days or even weeks to complete. While such known systems are highly desirable, their cost and complexity may preclude their use at a vast number of spraying applications that require field configuration—literally in a farm field, in a factory/production plant, in a shop, etc.

SUMMARY

Embodiments of the present invention provide a pre-calibrated spray plane image acquisition device comprising, in a single fixed-form structure, both an image capture component configured to acquire an optical image of a field of view and a light plane generator configured to generate a planar light plane emitted from the pre-calibrated spray plane image acquisition device. A carrier frame structure comprising rigid components is configured to permanently maintain the image capture component and the light plane generator in respective positions defining a permanent spatial relationship between the field of view of the image capture component and the light plane generated by the light plane generator. The permanent spatial relationship facilitates pre-calibrating image processing parameters before providing to a user of the image acquisition device. The parameters facilitate both correcting an image distortion and a scaling of a spray pattern image generated by an image acquisition device during a spray application by a nozzle positioned in a physical relationship with the light plane such that spray particles emitted from the spray nozzle pass through the light plane while an initial image is acquired by the pre-calibrated spray plane image acquisition device.

BRIEF DESCRIPTION OF DRAWINGS

FIGS. 10A and 10B are two side views of the spray plane image acquisition device of FIG. 9 in accordance with the present disclosure.

Figure 1A:
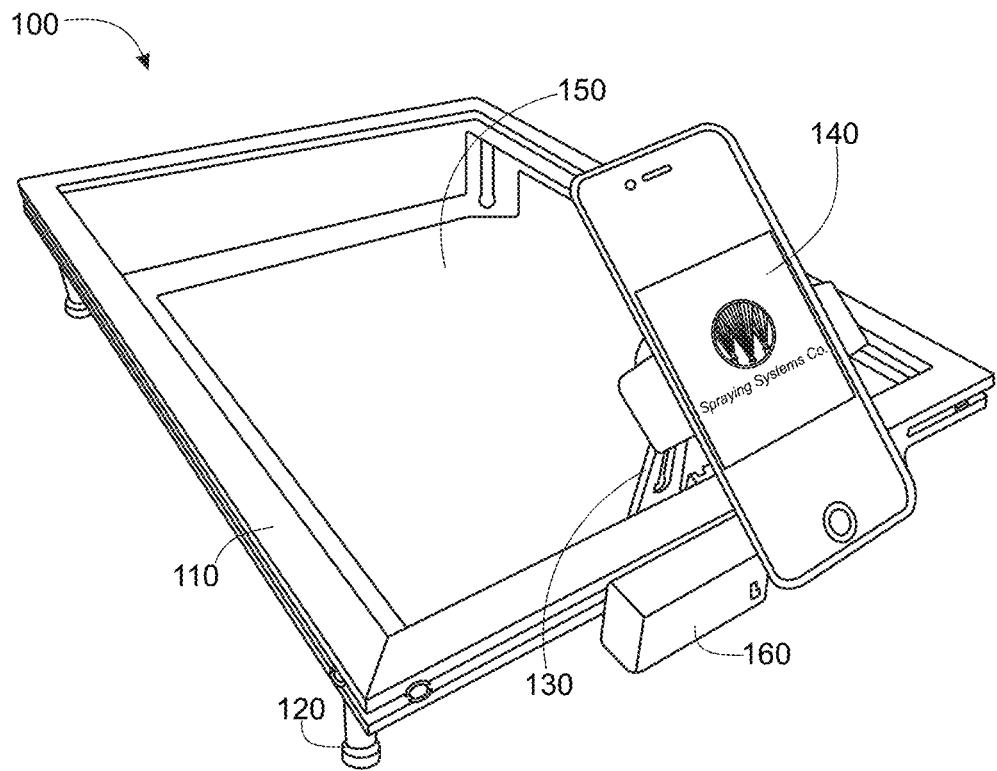
FIGS. 1A and 1B provide perspective views of two illustrative examples of a system embodying the current invention.

While the invention is susceptible of various modifications and alternative constructions, a certain illustrative embodiment thereof has been shown in the drawings and will be described below in detail. It should be understood, however, that there is no intention to limit the invention to the specific form disclosed, but on the contrary, the intention is to cover all modifications, alternative constructions, and equivalents falling within the spirit and scope of the invention.

DESCRIPTION OF EMBODIMENTS

Illustrative examples are now described that address the need to provide satisfactorily precise and accurate observations, in the form of a visual image, of spray distribution in the field (as opposed to test labs) and to carry out such observation with momentary feedback to users' adjustments to nozzle configuration and/or sprayed material properties. In accordance with particular illustrative examples, a light plane generator and an image capture component are provided in a single pre-calibrated spray plane image acquisition device. The single pre-calibrated spray plane image acquisition device incorporates permanent physical fixturing of the light-plane generator and the image capture component for acquiring an optical image of a droplet plane generated by spray passing through an illuminated plane generated by the light-plane generator. Importantly, an end-user is not required to perform image dimension calibration prior to use—as the acquired image is permanently obtained at a fixed relationship between the image capture component and the light-plane generator.

Referring to FIG. 1A, an illustrative spray distribution imaging system 100 is depicted. The illustrative system has utility in a wide variety of environments. However, the illustrative examples are particularly useful in the field or in situations where momentary spray pattern feedback to a current spraying application (configuration) is desired by a user. In the illustrative example, the system 100 includes a frame 110. The frame 110 is rectangular in the illustrative example and includes a set of legs (e.g. leg 120) disposed at each corner of the rectangular frame, thus providing a gap between the frame 110 and a surface upon which the system 100 is placed. The known rectangular shape of the frame 110 provides an important feature for normalizing/correcting an initially acquired image. The known aspect of the frame 110 also applies to a known length of the distal edge 112 (or portion thereof) of the frame 110 (or either side edge) that may be used to determine a distance of a feature within the initially acquired image.

Therefore, the known aspect of the frame 110 is not limited to dimensions of a rectangular shaped frame. Illustrative examples of the present disclosure may be any of a variety of shapes and configurations. For example, the frame 110 may be circular in shape. Moreover, any combination of visual features, having known physical dimensions (in a two-dimensional plane), indicated by the frame 110 are contemplated in meeting the "known aspect" of the frame 110. As such, in yet other examples, the frame 110 may have almost any shape as long as there are a set of visual features (e.g. corners, notches, markings) that are visually identifiable in a camera field of view to facilitate, within a captured camera image, at least: (1) correction of optical distortion (e.g. parallax) and (2) scale (determine two-dimensional sizing of) spray image features. Thus, in accordance with illustrative examples of the frame 110, the relative positions of the visually identifiable markings on the frame in a spray pattern image are used to correct for distortion and determine dimensions of spray pattern features.

Additionally, it is further noted that the frame 110 (with known aspects) need only be present during an initial calibration and/or configuration stage of operation of the system 100. Once a field of view of a camera in relation to an illuminated plane of a spray field of interest is established and fixed, the frame 110 may be withdrawn during subsequent acquisition of spray pattern (illuminated in a plane by LASER light source(s)).

A holder 130, which is optional (as shown in the system depicted in FIG. 1B), is mounted upon the frame 110. The holder 130 includes a grip structure that engages and holds a smart phone 140 (or other digital image acquisition device) in a stable/fixed relation to the frame 110 (i.e. to provide a steady image). In the illustrative example, the holder 130 is adjustable (via linear and pivoting adjustments) to enable positioning and orienting an imaging lens of the smart phone 140 in relation to a plane defined by edges of the frame 110.

Figure 1B:
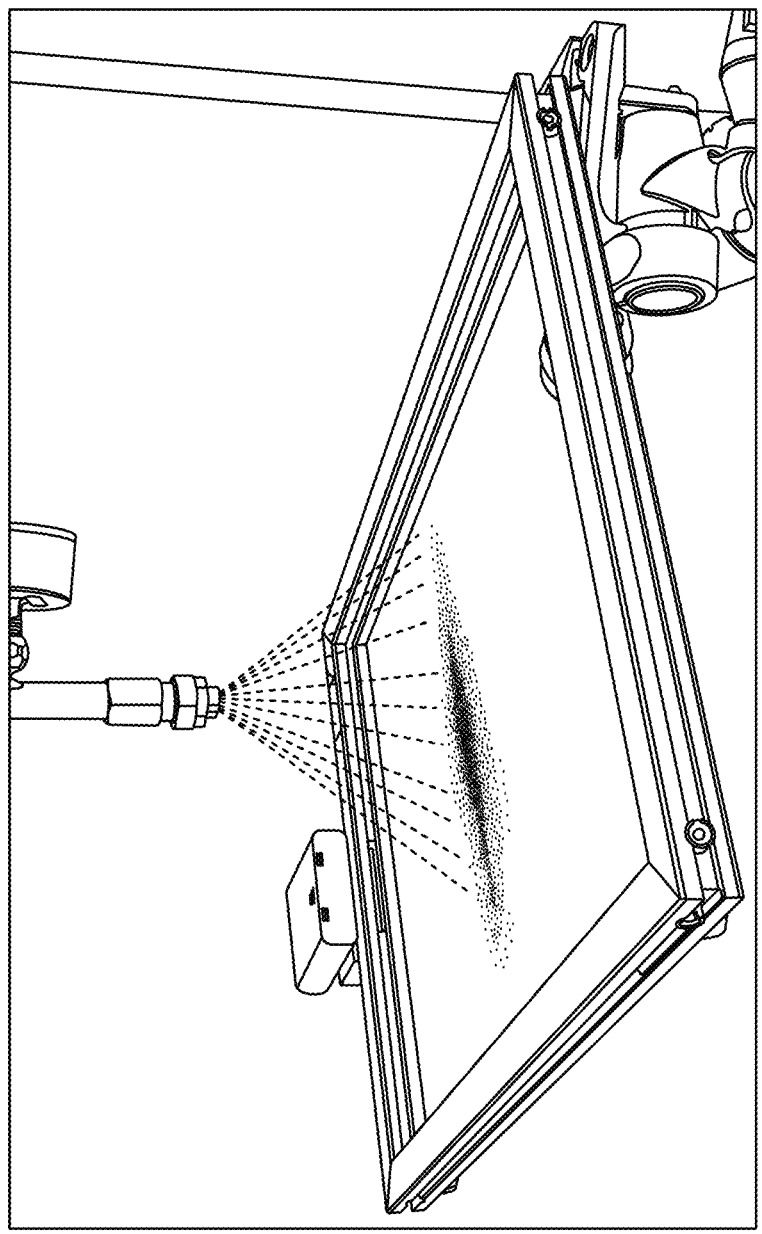

With continued reference to FIGS. 1A and 1B, a planar light source (not shown) emits a planar light pattern 150 in the plane defined by the edges of the frame 110. A battery pack 160 (or any suitable power supply) is provided to power the planar light source. In an illustrative example, the planar light source is provided by passing an output beam of a laser (e.g. a green laser, however other types of laser may also be used) through a diffraction grating to provide a suitably even distribution of light intensity in the planar light pattern 150. The use of a monochromatic (e.g. green) laser as the light source facilitates using the corresponding (green) data element of the initially acquired color image of the spray field to determine a spray density at a particular pixel location in the initially acquired image. A wide variety of planar light sources (not limited to a monochromatic/laser) are contemplated in various examples of the present disclosure.

In cases where a non-uniform distribution cannot be achieved, a suitable compensation factor can be applied to compensate for the variations in intensity. For example, a compensation factor may be applied according to an azimuthal angle from a point of the planar light source.

Moreover, the present disclosure contemplates additional forms of (programmed image processor implemented) compensating for light source effects, including compensating for viewing angle of a camera aperture (receiving the droplet scattered light from the planar light pattern generated by the planar light source) with respect to the source of the planar light pattern. Referring to FIG. 1B, for example, a scattered light intensity correction may be applied to account for a variation of intensity of scattered light received by the camera aperture based upon a relative scattering angle of light across the planar light pattern for a known position of the camera aperture in relation to a direction of the light emitted by the planar light source. By way of illustrative example, in FIG. 1B, a camera aperture is positioned such that a left-side of a wide-angle spray pattern is nearly in-line with rays of laser light emitted by the light source (at the far edge of the frame). On the other hand, the right-side of the wide-angle spray pattern is illuminated by light from the laser that is initially emitted relatively away from the camera. Therefore, a relatively large scattering angle is followed by the light on the right-side of the wide angle spray pattern that is received by the camera aperture.

The camera aperture position effect discussed above, as well as any other light source and/or aperture view effects, may range from negligible to severe depending on the planar light sheet source type (point vs planar), and relative distance from the source to the spray region.

The system 100 includes a programmed processor element that is, for example, incorporated into the smart phone 140—e.g. in the form an "app" program downloaded and maintained/executed on the smart phone 140. The programmed processor element is configured with computer-executable instructions that are executed by a processor of the smartphone to carry out operations of a method that is summarized by way of example in FIG. 7 (described herein below). In other illustrative examples, the programmed processor element is provided in any of a variety of computing devices, including tablet, notebook, and desktop computer systems.

Figure 2A:
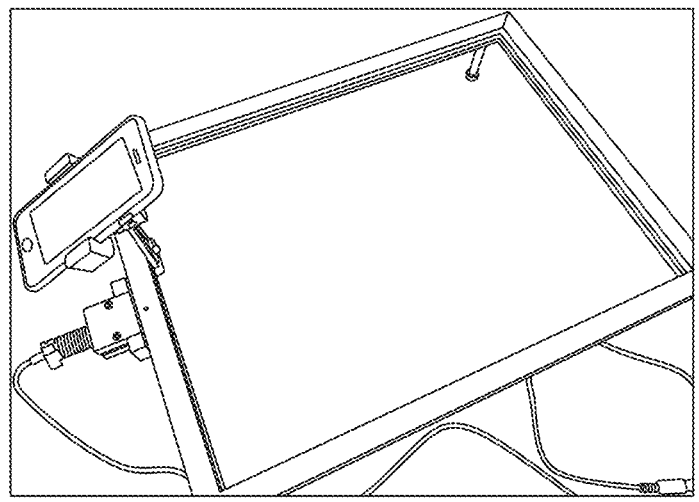
FIGS. 2A, 2B, and 2C are additional views of the systems illustratively depicted in FIGS. 1A and 1B.
Figure 2B:
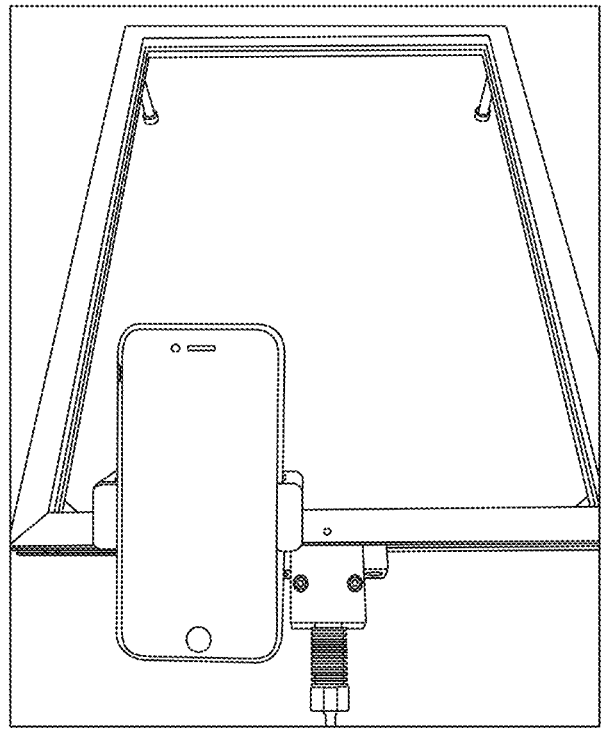

Turning to FIGS. 2A and 2B, two alternative views are provided of the system 100 depicted in FIG. 1A. In these two views, the battery power pack 160 is replaced by a continuous power supply (plugged into the system 100). The structure of the holder 130 (illustrative example) includes a repositionable mounting 170 that facilitates sliding the holder along an edge 180 of the frame 110.

Figure 2C:
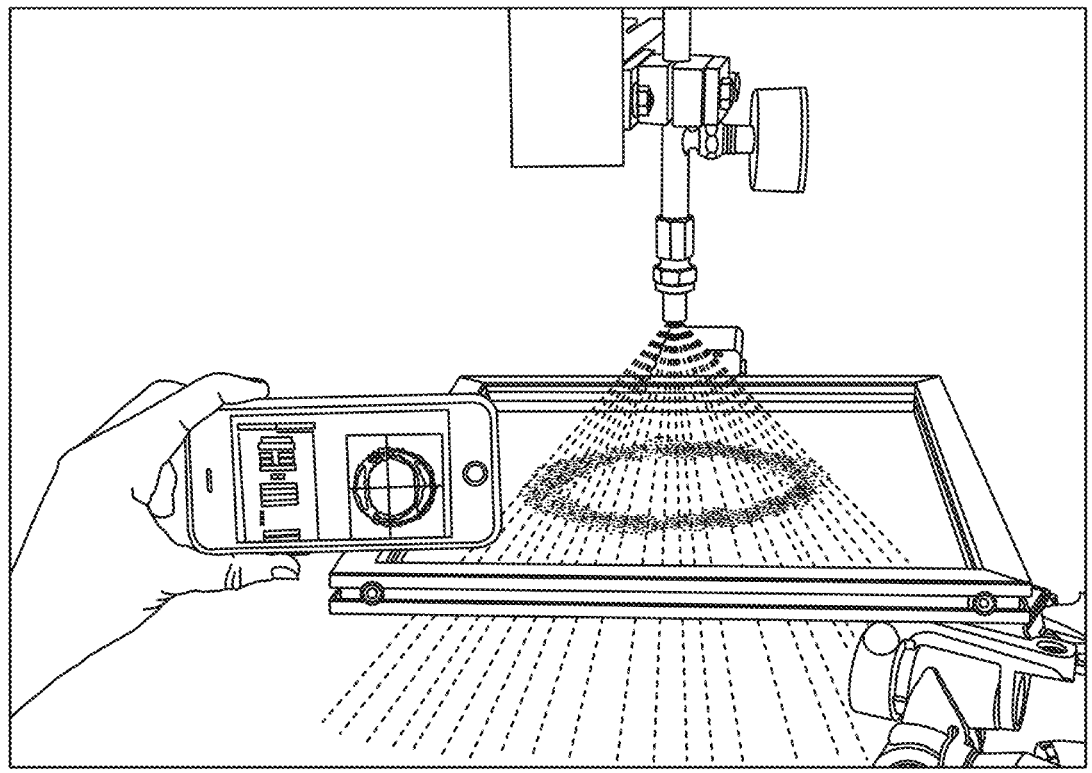

Turning to FIG. 2C an additional view is provided of the system depicted in FIG. 1B that shows an illustrative example of using the system 100 without a fixed holder such as the holder 130 depicted in FIGS. 2A and 2B. This version illustrates the utility of the "known aspects" of the frame 110 that facilitates providing a distortion correction/scaling source for each image—regardless of the position/orientation of the camera that acquires the image. In each captured image, the "known aspect" of the frame (captured within the image containing the captured spray pattern) facilitates performing an image distortion correction and scaling.

Figure 3A:
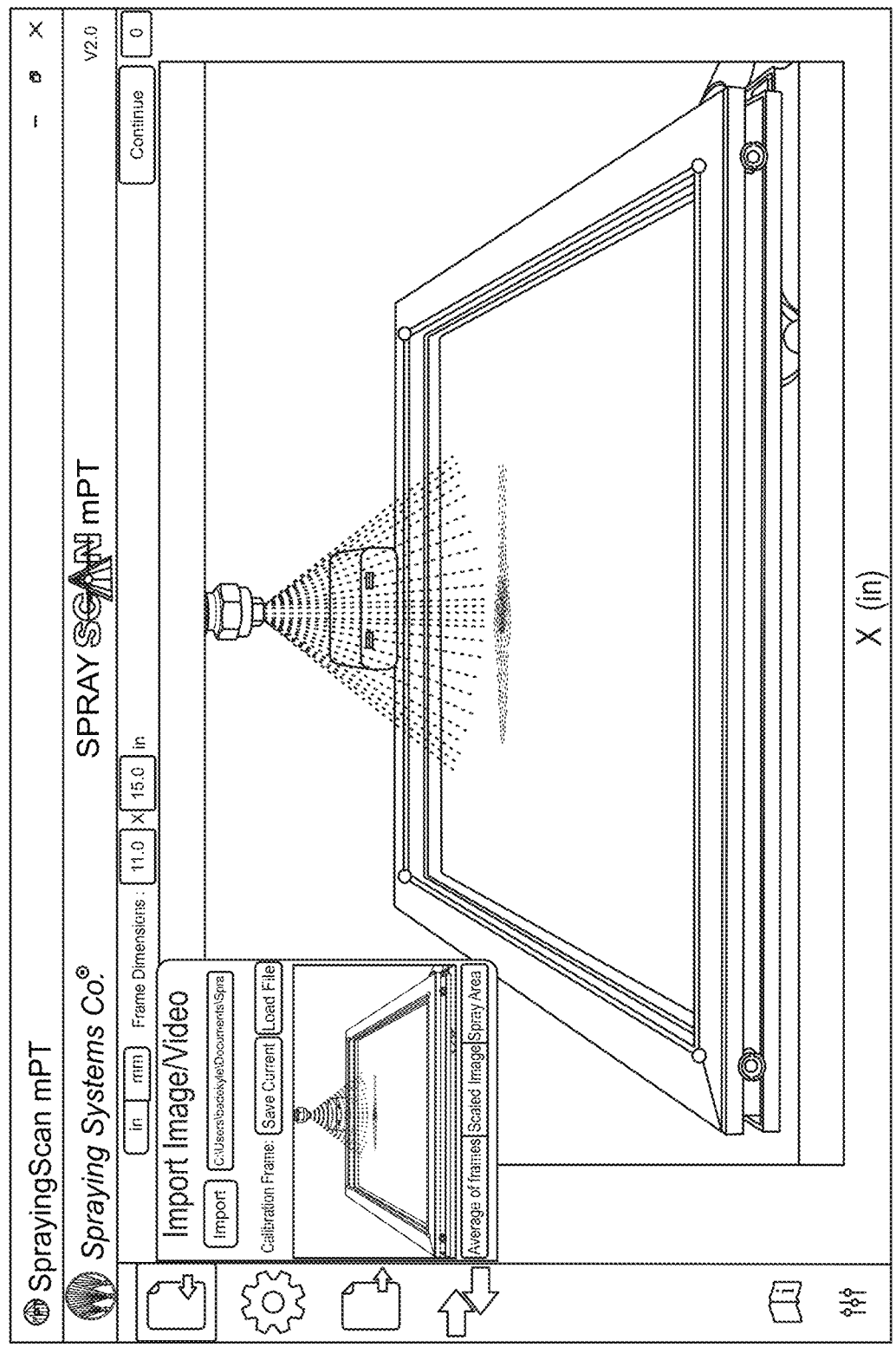
FIGS. 3A, 3B, 3C and 3D depict exemplary user interfaces for importing and selecting an image data (or portion thereof) acquired by an image acquisition device of the system depicted in FIGS. 1 and 2.
Figure 3B:
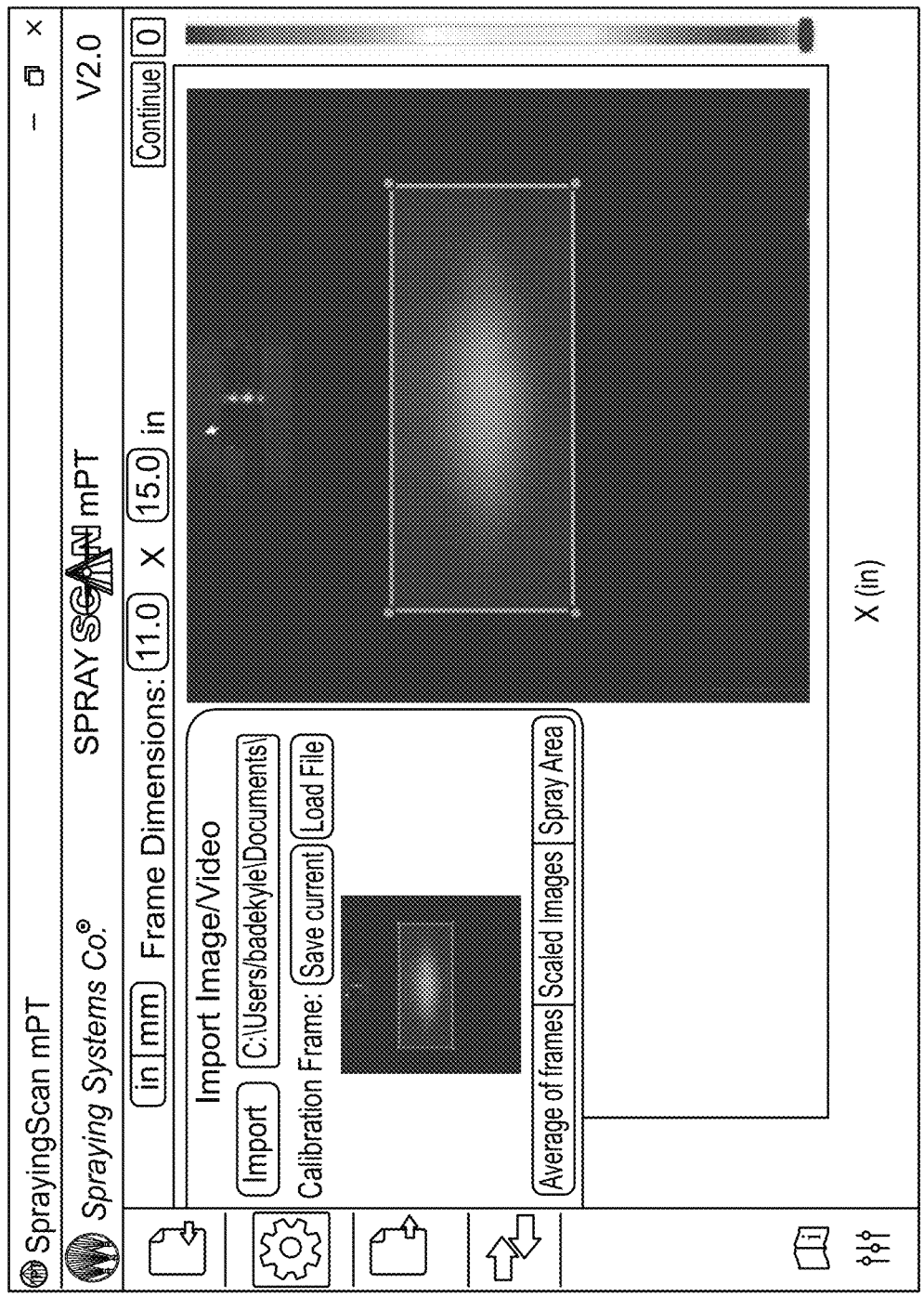

Turning to FIGS. 3A and 3B, two exemplary views of a captured spray image (displayed on an exemplary user interface) are provided. In the view provided in FIG. 3A, a captured spray image is displayed on a user interface that simultaneously displays the "known aspects" (i.e. a width of 11 inches and a length of 15 images) of the frame 110. The positions of the corners of the frame 110 and the known dimensions and shape of the frame 110 are used to correct image distortion and to scale the captured spray pattern within an imaging plane (defined by a planar light source generated in a substantially same plane as a plane defined by the frame 110. In FIG. 3B, the spray has been spatially corrected for distortion arising from the camera view angle.

Figure 3C:
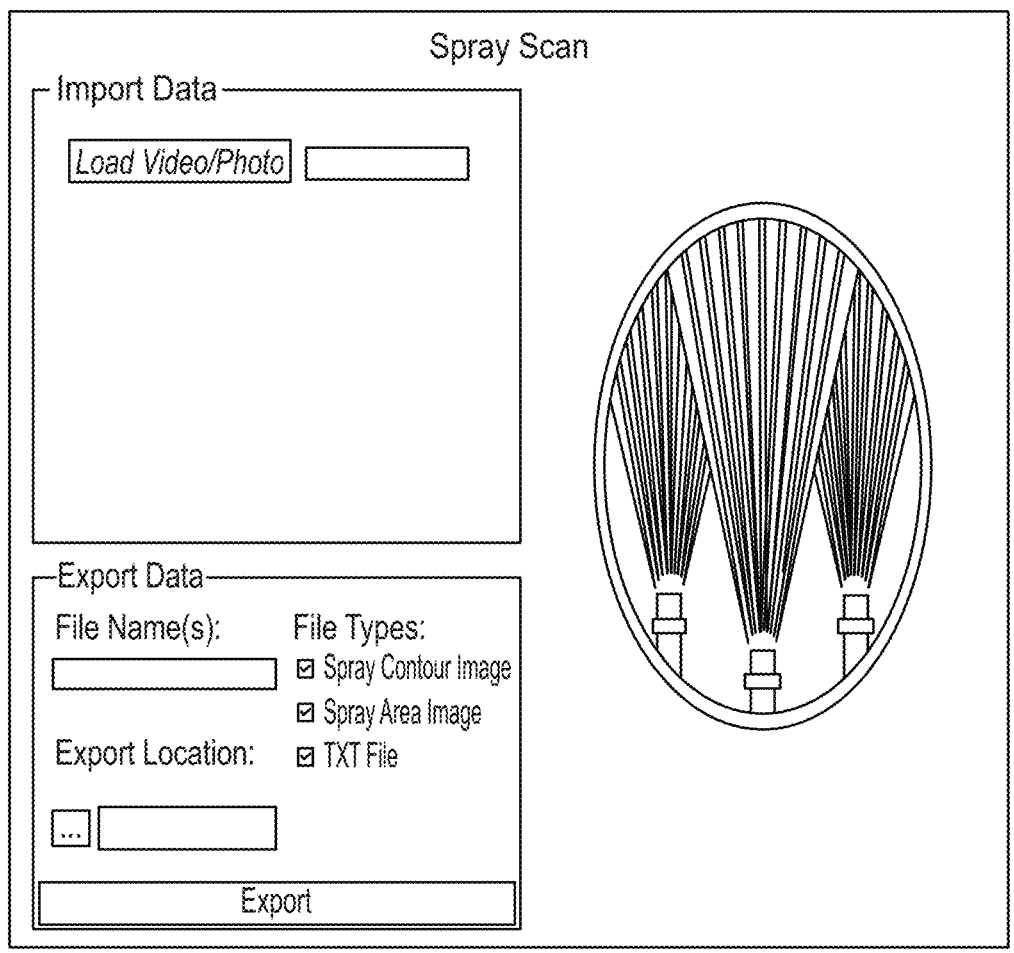
Figure 3D:
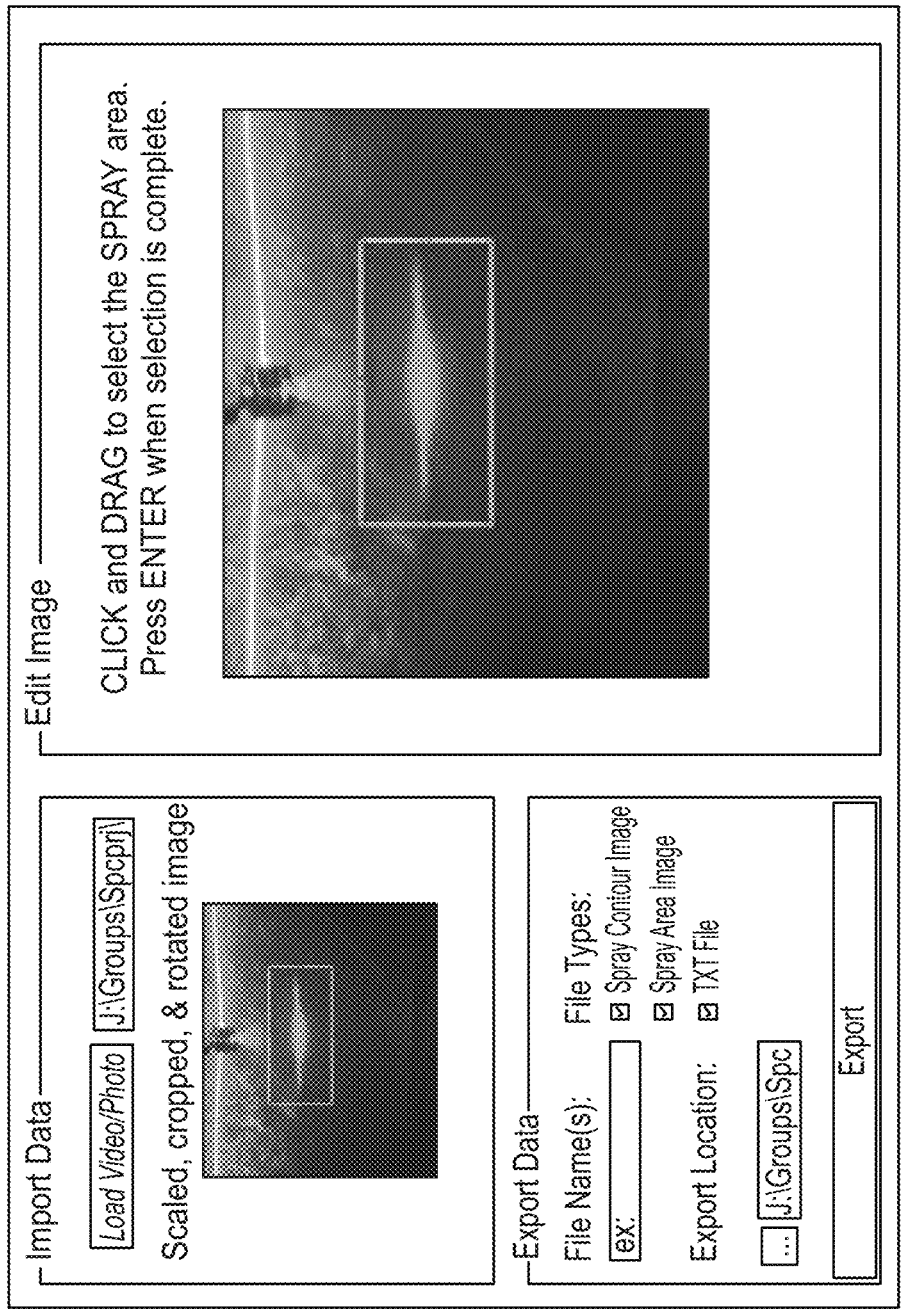

Turning to FIGS. 3C and 3D, an exemplary set of user interfaces, supported by the above mentioned app on the smart phone 140, enable a user to select a portion of a previously acquired image, which may be any type of image including both single static image (jpeg) frame, movie (mpeg) frame, time-lapse sequential image frame sets—such as those now supported by a "live" photo option on smart phones that acquire/store multiple sequential images in response to a single user "click" of a view. In the illustrative view, an import data field supports user selection of an image file for processing/viewing and designating an export data destination for the data. Additionally, an edit image field includes an image display sub-region and controls that enable a user to select a portion of a displayed image frame that will be the subject of further processing and/or storing. In the illustrative example, a control enables a user to "frame" the rectangle area of interest in the source image—for subsequent processing/saving by the system 100.

The system 100 supports acquiring, processing a variety of image data sources captured by a variety of camera types. In addition to static images, the system 100 contemplated acquiring, processing and displaying live (i.e. substantially real time) video. As such a wide variety of types of image/images generated by the system 100 are contemplated in accordance with various illustrative examples described herein.

Figure 4A:
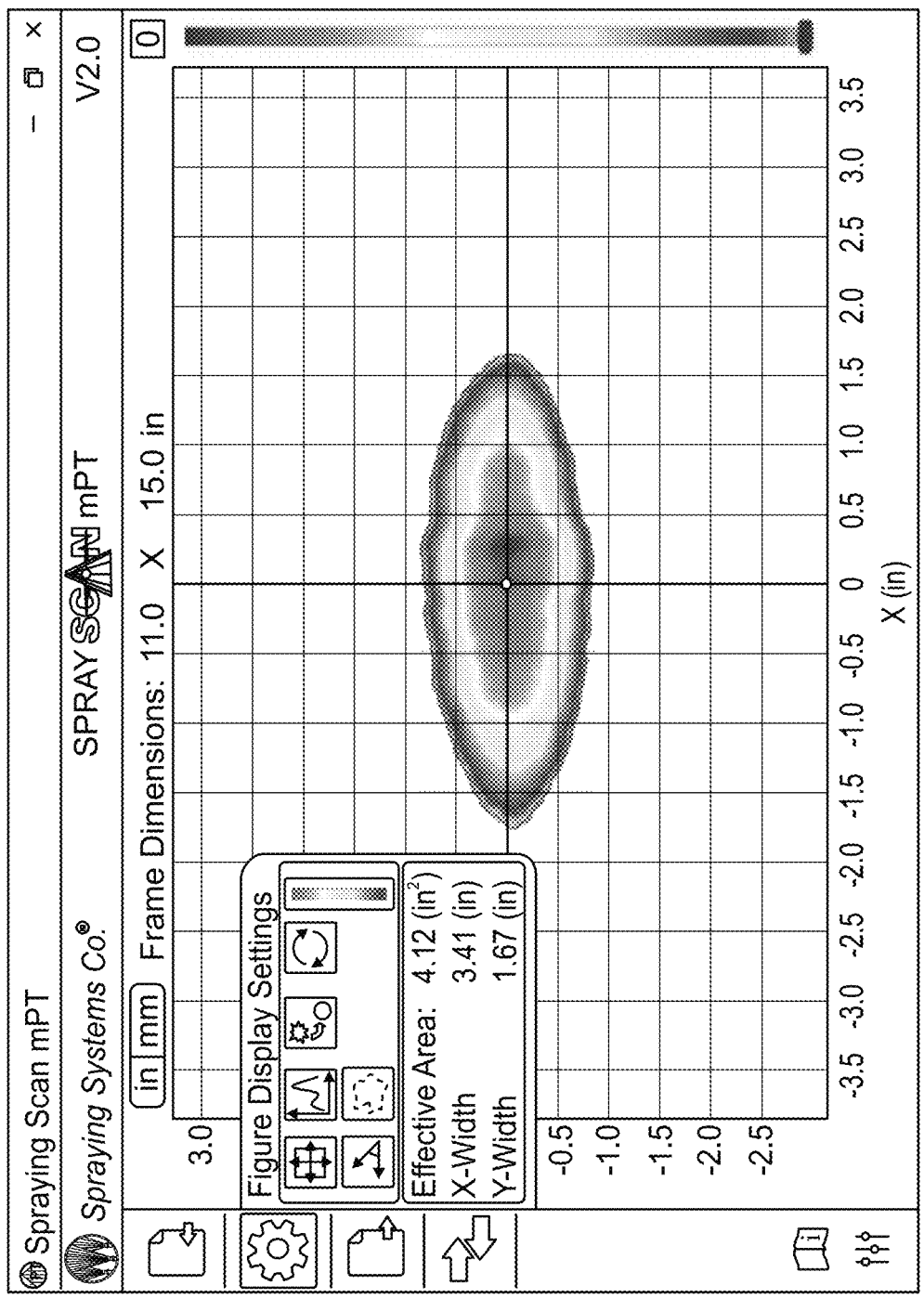
FIGS. 4A and 4B are illustrative grey scale images (from a colorized original) depicting both an extent and a density of a spray pattern, rendered from data acquired by the system depicted in FIGS. 1A, 1B, 2A and 2B.
Figure 4B:
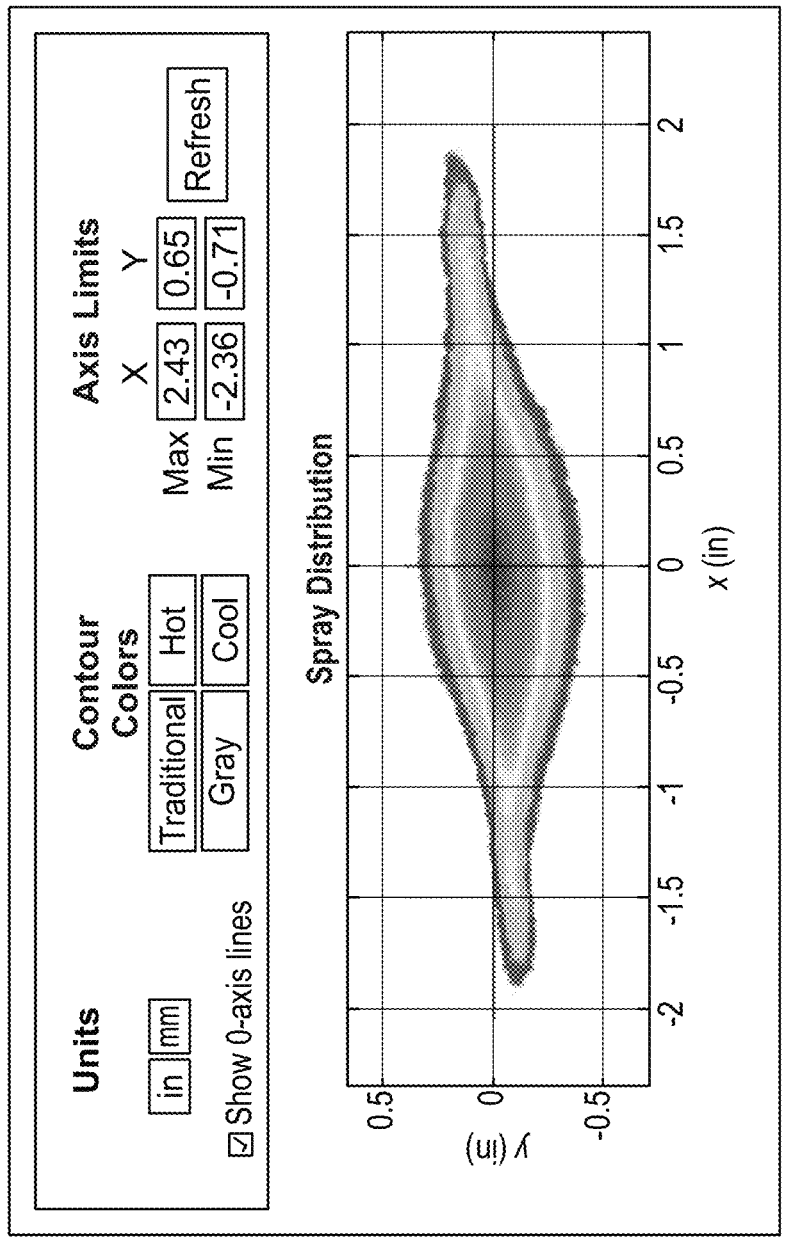

Turning to FIGS. 4A and 4B, two illustrative/exemplary views are provided of exemplary output (processed) image display interface, including an exemplary output image. In the illustrative example, the user interface supports user specification of units (inches/millimeters); contour (density) colors (including grey shades instead of color); and axis (image field of interest) limits. In the user interface depicted in FIG. 4B, a refresh button causes the system 100 to recalculate an output image based upon the selected parameters and display the image in the "Spray Distribution" field of the exemplary display. Thus, the "edit image" controls enable a user to configurably designate a part of an imported photographic image for further processing, analysis and display. In another illustrative output view, provided in FIG. 4A, the refresh button is not provided. Instead, the view updates the user/displayed view in response to a change in available displayed image (e.g. a new captured image, a user adjustment to a display parameter in an existing/displayed image, etc.).

Figure 5:
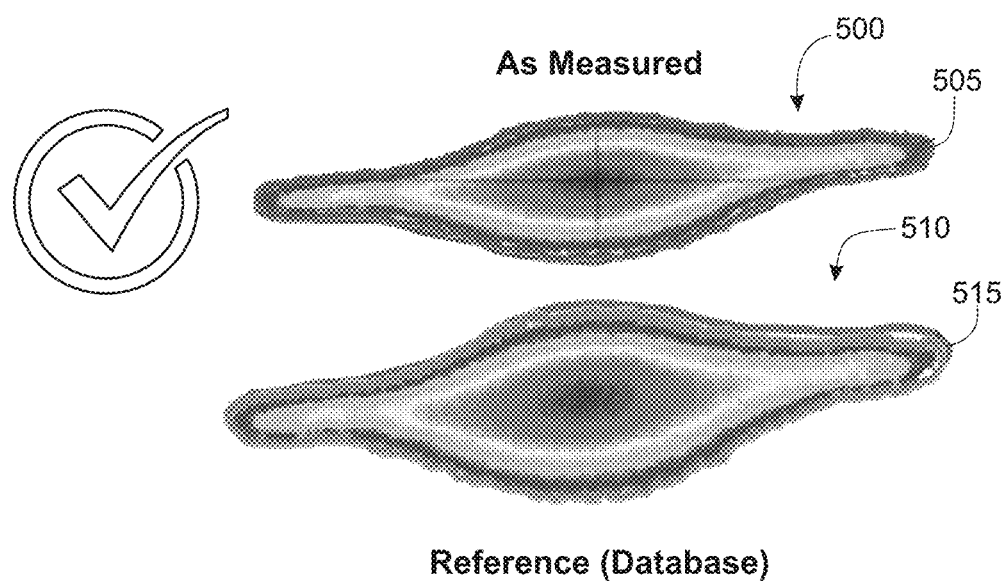
FIG. 5 is an exemplary view of a comparison rendered by the system and indicating a satisfactory observed spray pattern (in relation to a reference image)

Turning to FIG. 5, an illustrative example is provided of a type of analysis performed by the system 100 on a processed image (i.e. one that has been transformed into a graphical representation of overall coverage with displayed/distinguished regions of differing spray density. A measured spray pattern image 500 is depicted. The measured spray pattern image 500 includes an overall coverage area outline 505 that bounds a colorized (grey shaded) region that corresponds to the subregions of varying spray density. A reference spray pattern image 510 is depicted that is generated from a database (i.e. the expected pattern). The reference spray pattern image 510 includes an overall coverage area outline 515 that bounds a colorized (grey shaded) region that corresponds to the subregions of varying spray density. In the illustrative example, the measured image 500 is compared to the reference image 510 (either by the user or via a criteria-driven automated comparison executed on the smart phone 140 using the app program code executed by the processor. Since the coverage areas of the reference image 510 and the measured image 500 are substantially similar, the analysis renders a positive result (i.e. the spray application is properly configured).

Figure 6:
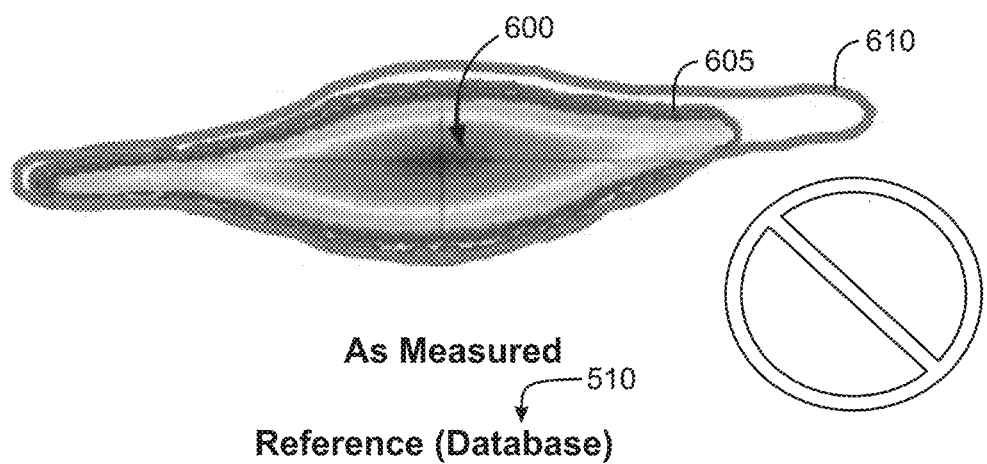
FIG. 6 is an exemplary view of a comparison rendered by the system and indicating a non-satisfactory observed spray pattern (in relation to a reference image)

On the other hand, FIG. 6 depicts a potential way of depicting a negative comparison result. In this case, a measured image 600 includes a measured coverage outline 605 that does not sufficiently track a reference outline 610. The outlines, by way of example, are carried out in an automated manner by the system 100. The programmed processor of the smart phone 140 detects the unacceptable deviation of the compared outlines and renders a negative result. In yet another view, the reference and measured images are compared and any resulting differences are represented by a two-dimensional colorized image depicted the differences where, for example, green means no difference, yellow means a slight difference, and red indicates a significant difference.

Figure 7:
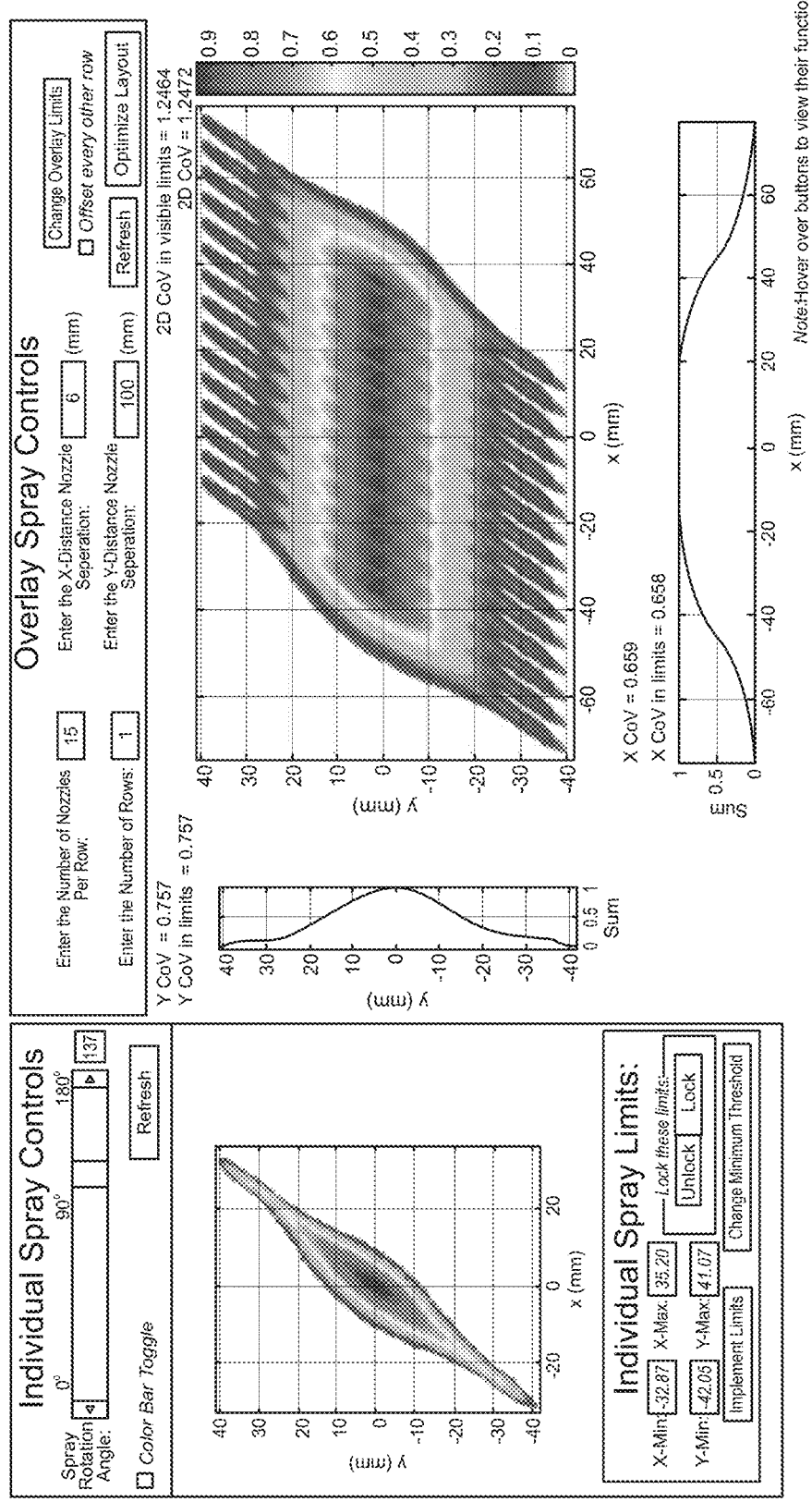
FIG. 7 is an exemplary view generated by combining multiple instances of a single observed spray pattern image.

Turning to FIG. 7, two exemplary views are provided. An "Individual Spray Controls" view depicts a scan image for a single spray nozzle acquired by the system 100. A rotation control enables a user to rotate the scan image up to 180 degrees. An "Individual Spray Limits" interface permits a user to define image limits for display/clipping of an input processes image. Turning to a "composing" feature, a composition image is depicted in the "Overlay Spray Controls" view. The composition image is created by a user specifying an input single nozzle image (e.g. the one depicted in the "Individual Spray Controls" view), specifying a number of nozzles (e.g. 15), a number of rows (e.g. 1), a gap between adjacent nozzles in a row (e.g. x=6 mm) and a column (e.g., 100 mm). In the illustrative example, the overlay composite image is a single composite row consisting of overlapping images generated from 15 nozzles separated by 6 mm. Additionally, two summation views (x-direction and y-direction) are provided for depicting accumulated (summed) spray density in the x and y directions, respectively.

Figure 8:
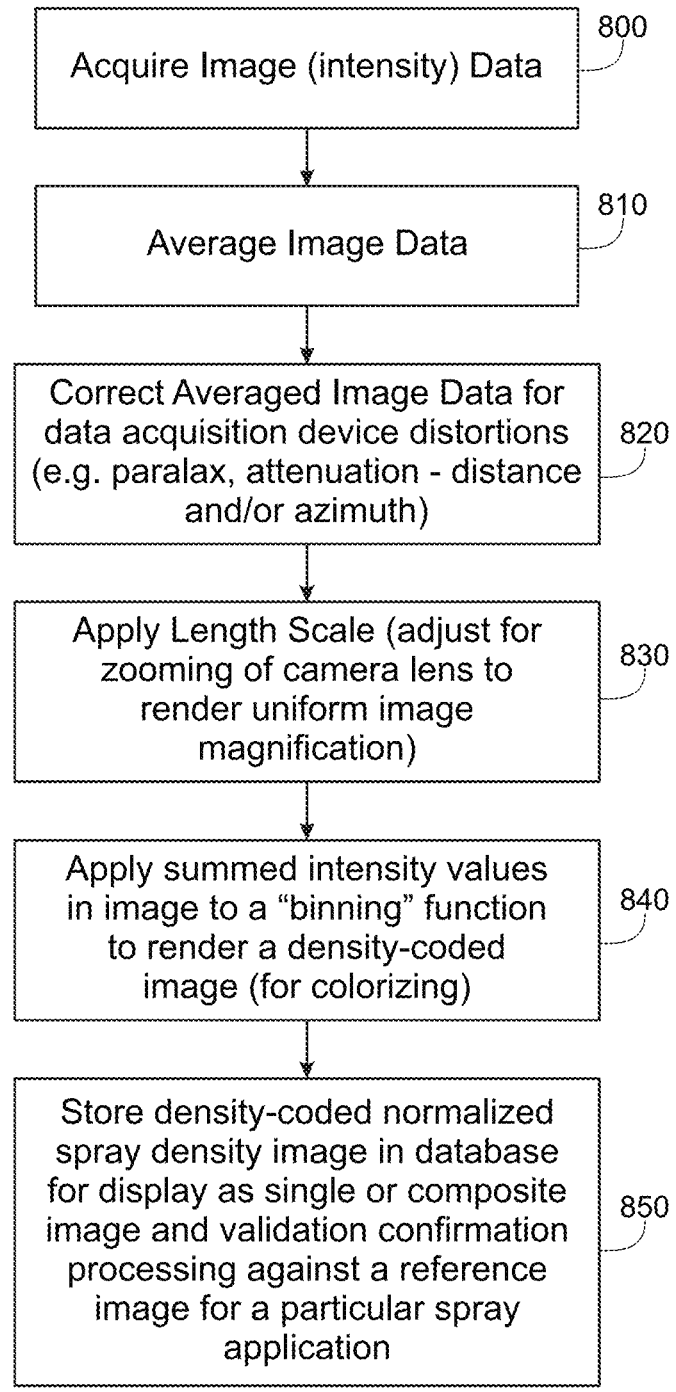
FIG. 8 is a flow diagram illustrating processes and data flow activities executed during an illustrative procedure for acquiring a spray pattern image data, processing the spray pattern image data, and rendering an image from the processed spray pattern image data in keeping with the invention.

Turning to FIG. 8, a flowchart summarizes the overall operation of the data acquisition and image processing/analysis operations performed by the system 100. During 800, an initial image data is acquired. In the illustrative system 100, a nozzle is positioned above the frame 110. As sprayed material passes from the nozzle and through the planar light pattern 150, an initial image data is acquired. As noted above, various forms of acquired images are contemplated including single static images (e.g. jpeg), a stream of live images (automatic high-repetition rate photo image function of smart phones), and movie image data (e.g. mpeg). The initial image (intensity) data includes red, green, and blue components. However, only the component corresponding to the color of the source laser (e.g. green) is used in later processing.

While a single image frame may be acquired during 800, it is preferable to acquire several frames and then average the pixel intensity values at corresponding locations across multiple image frames during 810. In the illustrative example, the "green" intensity component of corresponding pixel values is averaged across multiple frames.

During 820, the averaged image pixel intensity values rendered during 810 are corrected. In an illustrative example, the edges of the frame 110 are used to correct for parallax and any other distortions arising from the lens of the smart phone 140. The positions of the pixels are corrected in a two-dimensional space according to corrections needed to "straighten" the edges of the frame 110 (including ensuring the corners are 90 degrees). Additionally, intensity values are corrected, in an embodiment, to compensate for the decreased intensity of light based upon distance from the source and azimuthal angle position from the source.

During 830, the image is normalized by applying scalar value to positions on the image plane. The image scaling is intended to compensate for magnification/zooming during image acquisition by a user. In an illustrative example, a known length of one or more edges of the frame are used to determine a proper scaling value for normalizing the image data positions of the image data rendered by step 820.

During 840, intensity values of the various normalized intensity image data rendered during step 830 are applied to a binning function that assigns a discrete value in a limited range (e.g. 1 to 10) based upon the intensity value at the particular normalized pixel location. Thus, the output of 840 is a corrected, normalized, discrete density-coded image data.

During 850, the corrected, normalized, discrete density-coded image data is stored, for example, in a memory of the smart phone 140. Thereafter, a user selects the stored data for purposes of viewing in accordance with the various user interfaces depicted in FIGS. 4A, 4B, 4C, 5, 6, and 7. A user-selected color mapping scheme is thereafter used to render a colorized (or gray scale) image of the coverage area and density characteristics of the measured spray application.

Figure 9:
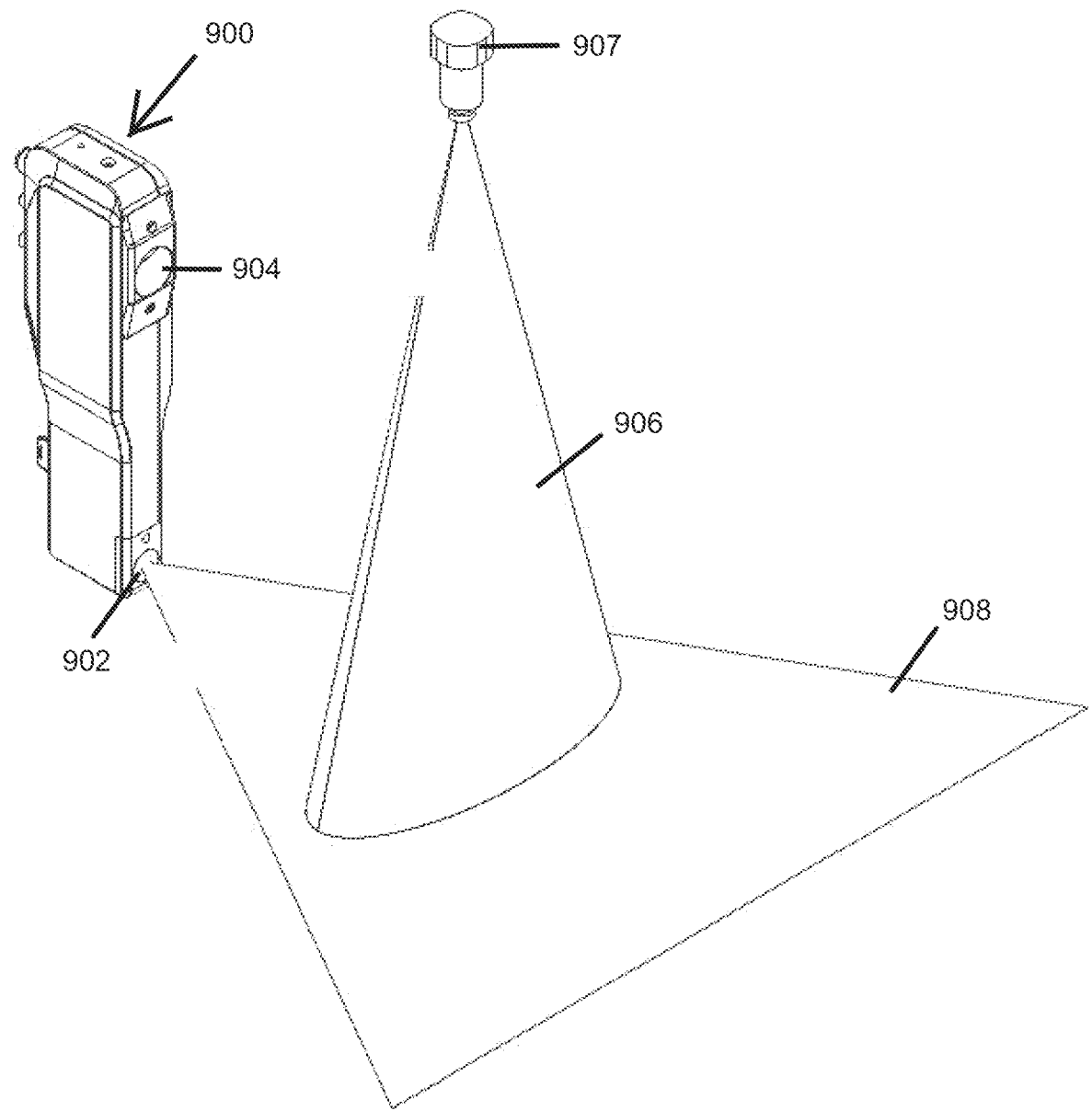
FIG. 9 is a perspective drawing of a single pre-calibrated spray plane image acquisition device in accordance with the current disclosure.

Turning to FIG. 9, in accordance with a further illustrative example, a single pre-calibrated spray plane image acquisition device 900 is depicted that includes a light plane generator 902 and an image capture component 904. By way of example, the light plane generator 902 comprises a laser (e.g., green laser) and associated spreading and filtering optical elements to render an illuminated plane 908. However, any of a variety of light sources may be used to generate the illuminated plane 908. The image capture component 904 is, by way of example, a 12M pixel digital camera. In the illustrative example, the device 900 is on the order of 1 foot in length, or less. More particularly, the device 900 has a linear distance between the image capture component 904 and the light plane generator 902 of at least a half a foot, and less than one-and-one half feet (i.e., on the order of one foot). Even more specifically, the linear distance between a lens of the image capture component 904 and the light plane generator 902 is seven inches. The device 900 is a relatively compact and highly portable device (on the order of a foot in length) that is suitable for quickly/easily fixturing into place to perform spray field image capture without any need to remove a nozzle of interest from an operational position. The device may, indeed, be hand-held in place to acquire a spray field image of interest.

The single pre-calibrated spray plane image acquisition device 900 incorporates permanent physical fixturing of the light plane generator 902 and the image capture component 904 for acquiring an optical image of a droplet plane generated by a spray 906, from a nozzle 907 under test, passing through the illuminated plane 908 generated by the light plane generator 902. The image capture component 904 is configured to have a field of view that includes at least part of the illuminated plane 908 through which the spray 906 passes. The fixed nature of a field of view of the image capture component 904 in relation to the illuminated plane 908 generated by the light plane generator 902 enables calibration and correction of images acquired by the image capture component 904 in the illuminated plane 908 based on scaling and image correction parameters provided at the time of manufacturing and initial configuration of the pre-calibrated spray plane image acquisition device 900 prior to distribution to end users. As such, the current invention addresses a technological problem for users that are unfamiliar with spray field image acquisition devices and associated image scaling/correction associated with such devices.

Figure 10B:
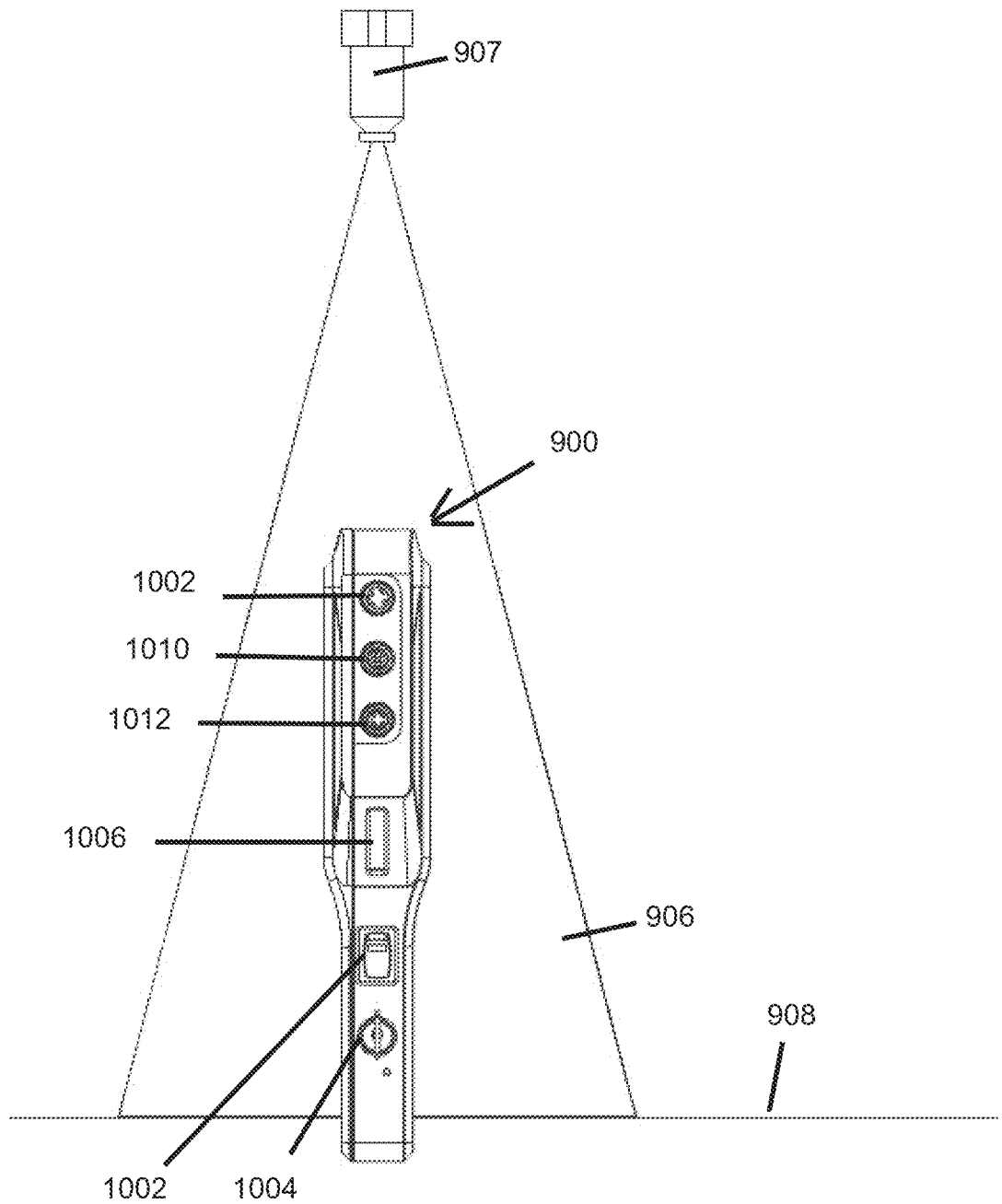

Turning to FIGS. 10A and 10B, two perspective schematic views are provided of the pre-calibrated spray plane image acquisition device 900 depicted in FIG. 9. In accordance with a illustrative example, the device 900 includes an outer case 1000 with opening provided for a number of switches including a power button 1002 and a key switch 1004 to ensure safe operation of a laser source that generates the illuminated plane 908. The device 900 also includes a display 1006 (e.g., an organic light-emitting display. In accordance with the illustrative example, the device 900 includes a processor 1008 and associated input/output 1010, Ethernet/local area network 1012, and input power 1014 interfaces.

In accordance with the present disclosure, the outer case 1000 and other physical structures (e.g. a printed circuit board, fixturing structures) of the device 900 are configured with physical structures and features for maintaining, after manufacturing/pre-calibrating, the illuminated plane 908 generated by the light plane generator 902 and the image capture component 904 in a permanently fixed spatial relationship.

The device 900, including the outer case 1000, is configured to provide a suitable illumination plane by the light plane generator 902 and image capture component 904 (digital camera) that have a permanently fixed relative physical/spatial relationship—unless the device 900 is disassembled by opening the outer case 1000 and moving one or more of the light plane generator 902 and the image capture component 904. Importantly, as a result of the permanently fixed relative physical/spatial relationship between the light plane generator 902 and the image capture component 904, an end-user is not required to perform image dimension calibration prior to use of the device 900 of FIGS. 9, 10A, and 10B— as the acquired image is obtained by the device 900 in accordance with a fixed spatial relationship between the image capture component (camera lens 1016) and the illuminated plane 908 provided by the light plane generator 902.

The device 900, in accordance with an illustrative example, operates according to programmed functionality under control of the processor 1008. By way of example, the device 900 is configurable to take a plurality of images and then transmit them in the form of processed images (including filtering based on a plurality of sequentially acquired images of a spray cloud passing through the illuminated plane 908). Various configurable parameters for the operation of the device 900 include specifying a repetition period (i.e. time period between starts of monitoring cycles for image acquisition, data acquisition duration once image acquisition commences).

In all respects, the device 900 supports imaging for carrying out the functionality described herein above with reference to an image acquisition device where an illumination plane and image acquisition device are not maintained in a permanently fixed relation to one another—thus requiring a calibration of the field of view of the image capture component. Such functionality includes: real-time in-process monitoring, spray pattern parameter (e.g., size, shape, coverage, uniformity and distribution density) determination, cloud-based accumulation of image data sets, customized determination of spray pattern irregularities, alerting/alarming, historizing, trending, etc. The above functionality is configured and carried out via user interfaces driven by the image data rendered and transmitted by the device 900 to a communicatively coupled data sink, such as a database server or a particular subscriber device that receives and displays the provided spray image frames rendered by the device 900. In yet other examples, the data drives a closed loop control that controls the operation of a spray nozzle(s) based on machine learning-based analysis of the images rendered by the device 900.

It will be appreciated that the foregoing description relates to examples that illustrate a preferred configuration of the system. However, it is contemplated that other implementations of the invention may differ in detail from foregoing examples. As noted earlier, all references to the invention are intended to reference the particular example of the invention being discussed at that point and are not intended to imply any limitation as to the scope of the invention more generally. All language of distinction and disparagement with respect to certain features is intended to indicate a lack of preference for those features, but not to exclude such from the scope of the invention entirely unless otherwise indicated.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A pre-calibrated spray plane image acquisition device comprising, in a single fixed-form structure:
    an image capture component configured to acquire an optical image of a field of view;
    a light plane generator configured to generate a planar light plane emitted from the pre-calibrated spray plane image acquisition device; and
    a carrier frame structure comprising rigid components configured to permanently maintain the image capture component and the light plane generator in respective positions defining a permanent spatial relationship between the field of view of the image capture component and the light plane generated by the light plane generator,
    wherein the permanent spatial relationship facilitates pre-calibrating image processing parameters before providing to a user of the image acquisition device, wherein the parameters facilitate both correcting an image distortion and a scaling of a spray pattern image generated by the image acquisition device during a spray application by a nozzle positioned in a physical relationship with the light plane such that spray particles emitted from the spray nozzle pass through the light plane while an initial image is acquired by the pre-calibrated spray plane image acquisition device.

2. The pre-calibrated spray plane image acquisition device of claim 1, wherein the carrier frame structure comprises an outer case.

3. The pre-calibrated spray plane image acquisition device of claim 1, wherein the pre-calibrating includes establishing a scale for distances within the field of view.

4. The pre-calibrated spray plane image acquisition device of claim 3, wherein the pre-calibrating includes correction of individual portions of the field of view for image distortion arising from a lens of the image capture component.

5. The pre-calibrated spray plane image acquisition device of claim 1, wherein the light plane generator comprises a laser.

* * * * *